(12) United States Patent
Fleischer (10) Patent No.: US 10,193,498 B2
(45) Date of Patent: Jan. 29, 2019

(54) METHOD AND SYSTEM FOR BOOSTING THE SUPPLY OF POWER AMPLIFIER

(76) Inventor: David Leonardo Fleischer, Jerusalem (IL)

(*) Notice: Subject to any disclaimer, the term of this patent is extended or adjusted under 35 U.S.C. 154(b) by 0 days.

(21) Appl. No.: 14/124,727

(22) PCT Filed: Jun. 14, 2012

(86) PCT No.: PCT/IL2012/000234
§ 371 (c)(1),
(2), (4) Date: Mar. 13, 2014

(87) PCT Pub. No.: WO2012/172544
PCT Pub. Date: Dec. 20, 2012

(65) Prior Publication Data
US 2014/0191797 A1    Jul. 10, 2014

(30) Foreign Application Priority Data

Jun. 16, 2011 (IL) .......................................... 213624

(51) Int. Cl.
| | |
|---|---|
| H03G 3/20 | (2006.01) |
| H03F 1/02 | (2006.01) |
| H03F 3/24 | (2006.01) |
| H04L 27/26 | (2006.01) |
| H03F 3/189 | (2006.01) |

(52) U.S. Cl.
CPC .............. *H03F 1/02* (2013.01); *H03F 1/025* (2013.01); *H03F 3/189* (2013.01); *H03F 3/24* (2013.01); *H04L 27/2614* (2013.01)

(58) Field of Classification Search
CPC .............................. H03F 1/0222; H03F 1/025
USPC ....................... 330/127, 136, 280; 455/127.1
See application file for complete search history.

(56) References Cited

U.S. PATENT DOCUMENTS 7,970,362 B2 * 6/2011 Minnis ................. H03F 1/0205
330/280
2006/0028271 A1 * 2/2006 Wilson .......................... 330/199

* cited by examiner

*Primary Examiner* — Steven J Mottola
(74) *Attorney, Agent, or Firm* — Fish IP Law, LLP (57) ABSTRACT

The present invention relates to a system for boosting the power supply of an RF power amplifier in high peak to average power ratio applications, wherein said power amplifier is coupled to receive and amplify a digital data stream of a baseband signal, (e.g., which after modulation with a carrier wave are supplied as the RF input signal to said power amplifier to generate an RF output signal). Said system comprises: a) a first circuit for controlling said boost by said digital data stream of said baseband signal in open-loop, wherein the timing of said boost event can be adjusted according to delays in the data stream of said system, wherein said boost event is imparted as a copy of the most significant bits of said baseband signal; and b) a second circuit for adjusting the precise timing of said boost event in such a way that the signal which controls said second circuit is the result of a comparison between a digital form of said RF input signal and/or a digital representation of the waveform of said power supply and said digital baseband signal, wherein said comparison represents the substantial matching of the delays in the paths of RF input signal and said power supply.

11 Claims, 8 Drawing Sheets

Fig. 1
(Prior Art)

Fig. 2
(Prior-Art)

Dickson-Type Charge Pump

Fig. 7A

Non-Overlapping Clocks

METHOD AND SYSTEM FOR BOOSTING THE SUPPLY OF POWER AMPLIFIER

FIELD OF THE INVENTION

The present invention relates to the field of wireless communications systems characterized by high Peak-to-Average Power Ratio such as OFDM or other Frequency-Division Multiplexing (FDM) scheme used as a digital multi-carrier modulation method. More particularly, the invention relates to a method and system for boosting the supply voltage of the RF amplifier on the fly in order to reduce the power consumption of the system while not affecting significantly the bit error rate.

BACKGROUND OF THE INVENTION

Radio Frequency (RF) Power Amplifiers (PA) are widely used in a variety of RF based communication systems and applications such as mobile phones, cellular networks, and other electronic devices. RF power amplifiers are used in these devices to amplify RF signals in order to transmit the RF signals remotely. RF PAs are one of the most significant sources of power consumption in these communication systems, and their efficiency has a significant impact on the power supply in these communication systems. For example, mobile telephone makers make great efforts to increase the efficiency of the RF PA circuits, because the efficiency of the RF PA is one of the most critical factors determining the battery life of the mobile telephone and its talk time.

Several systems claim to reduce the power consumption of digital communication systems with high peak-to-average power ratio, such as OFDM (Orthogonal Frequency-Division Multiplexing), either by performing transforms in the digital domain to cancel the effect of the high peak-to-average ratio, or in the analog domain by changing the supply or bias of the power amplifier in order to adjust on the fly for the varying power ratio. The first type of systems are quite elegant in theory since they eliminate the effect of the high Peak-to-Average Power Ratio (PAPR) altogether, however even in the current very advanced semiconductor processes the amount of computation required to do so, and therefore the power consumption itself is quite substantial; which adversely affects the efficiency they set to improve in the first place.

The second type of systems recognize that the power amplifier has to operate linearly in order to transmit a signal with a low bit error rate, and therefore suitably change the supply or bias voltages of the amplifier in real time according to the data signal being transmitted. This type of systems may conserve power in principle by dynamically maintaining the minimum necessary supply levels on the power amplifier. However, in the prior art some part of the control circuits are also operating linearly and hence waste more power to respond fast enough. Changing the bias on the fly is also not practical, since linear circuits require time to adjust their linear operation for a changed bias condition; and inserting blank periods between transmitted symbols goes against the intrinsic advantages of orthogonal frequency type of communication systems.

To address these issues and to provide an RF power amplifier with an increased efficiency, an enhanced boosting solution for the supply of power amplifiers in high peak to average power ratio applications is required.

It is an object of the present invention to provide a system which is capable of boosting the supply of the power amplifier in high peak to average power ratio applications.

It is another object of the present invention to provide an RF power amplifier with an economic consumption of power.

Other objects and advantages of the invention will become apparent as the description proceeds.

SUMMARY OF THE INVENTION

The present invention relates to a system for boosting the power supply of an RF power amplifier in high peak to average power ratio applications, wherein said power amplifier is coupled to receive and amplify a digital data stream of a baseband signal, (e.g., which after modulation with a carrier wave are supplied as the RF input signal to said power amplifier to generate an RF output signal). Said system comprises: a) a first circuit for controlling said boost by said digital data stream of said baseband signal in open-loop, wherein the timing of said boost event can be adjusted according to delays in the data stream of said system, wherein said boost event is imparted as a copy of the most significant bits of said baseband signal; and b) a second circuit for adjusting the precise timing of said boost event in such a way that the signal which controls said second circuit is the result of a comparison between a digital form of said RF input signal and/or a digital representation of the waveform of said power supply and said digital baseband signal, wherein said comparison represents the substantial matching of the delays in the paths of RF input signal and said power supply.

According to some embodiments of the present invention, said second circuit is not found in the direct path of said power amplifier and hence is economical in terms of power.

According to an embodiment of the present invention, the boost event is delivered through a plurality of capacitors. In one embodiment, the capacitors are configured as a switch-capacitor circuit of the charge-pump variety. The shape of the boost event is generated by capacitive coupling from a single DC voltage. Alternatively, the pluralities of capacitors are ratioed in such a way that the appropriate boost event is shaped to track the form of the RF input signal.

According to an embodiment of the present invention, the first circuit comprises a plurality of switches each of which is connected to a different voltage. The first circuit can be used with any type of power amplifier for many different types of electronic devices, such as power audio amplifiers.

According to an embodiment of the present invention, the precise timing between the signal supplied to the power amplifier and its power supply is adjusted by means of an elastic buffer (FIFO) that introduces an adjustable delay, wherein said elastic buffer is implemented with a Delay Locked Loop circuit.

According to an embodiment of the present invention, the second circuit comprises an auxiliary analog to digital (A/D) converter which samples the RF signal at the input and/or the power supply of said power amplifier, and a digital circuit which performs a correlation of the data of said auxiliary A/D with the most significant bits of the baseband digital stream. The precise timing of the boost event is either delayed or brought forward according to the results of said correlation with the data from the second circuit.

According to an embodiment of the present invention, the delay in the path of the first circuit is substantially matched to the delay in the path of the RF input signal to the power amplifier.

The present invention further relates to a method for boosting the supply of power amplifier in high peak to average power ratio applications, the method comprising the steps of: a) selecting a supply voltage for the power amplifier based upon the most significant bits of a digital baseband input signal; and b) correlating said baseband input signal with a digital version of the converted RF input and/or power supply signal to generate a correction signal indicative of the phase difference between said correlated digital signals, wherein said correction signal adjusts the precise timing of said supply voltage to match the RF input signal. The phase delay introduced by the first circuit is substantially matched to the delay in the path of the RF input signal to the power amplifier.

DETAILED DESCRIPTION OF PREFERRED EMBODIMENTS

The Figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

The present invention provides a conventional amplifier system (e.g., such as the one described with respect to FIG. 1 herein below) with a plurality of capacitors, which can be configured as a charge pump type circuit, to increase the power efficiency of the amplifier system. The charge pump may switch between a fixed input DC voltage and a boosted value for a certain period of time in response to an increase in an input signal to the amplifier. The charge pump may use a switching transistor which is switched on only when the input signal to the amplifier exceeds a threshold. The amplifier system may be used for envelope tracking, e.g., Frequency Division Multiple Access (FDMA), or other conventional cellular systems. The amplifier system may also be used for high peak-to-average systems with low duty cycles such as in xDSL, ADSL and VDSL.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
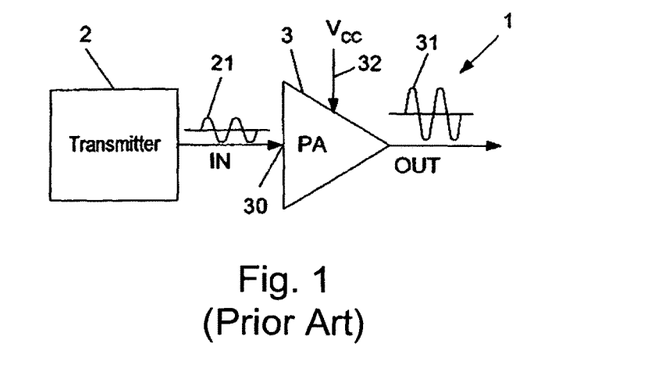
FIG. 1 schematically illustrates a conventional RF transmitter circuit, according to the prior-art.

FIG. 1 illustrates a conventional RF transmitter circuit 1, including a transmitter 2 and a power amplifier (PA) 3. For example, the RF transmitter circuit may be included in a cellular telephone device using one or more cellular telephone standards such as LTE (Long Term Evolution), although the RF transmitter circuit may be included in any other type of RF electronic device. For purposes of illustration only, the RF transmitter circuit will be described herein as a part of a cellular telephone device. The transmitter 2 generates the RF signal 21 to be amplified by the PA 3 and transmitted remotely (i.e., the output signal 31 from PA 3) by an antenna (not shown). For example, the RF signal 21 may be an RF signal modulated by the transmitter 2 according to the LTE standard.

The RF power amplifier 3, in general, includes an output transistor (not shown) for its last amplification stage. When an RF modulated signal 21 is amplified by the RF PA 3, the output transistor tends to distort the RF modulated signal 21, resulting in a wider spectral occupancy at the output signal 31 than at the input signal 21. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 21 is amplitude-modulated, the output transistor of the PA 3 needs to be biased in such a way that it remains linear at the peak power transmitted. This typically results in power being wasted during the off-peak of the amplitude of the RF input signal 21, as the biasing remains fixed for the acceptable distortion at the peak power level.

In the prior art, certain RF modulation techniques have evolved to require even more spectral efficiency, and thereby forcing the RF PA 3 to sacrifice more efficiency. For instance, while the efficiency at peak power of an output transistor of the PA 3 can be above 60%, when a modulation format such as OFDMA is used, with certain types of coding, the efficiency of the RF PA 3 falls below 30%. This change in performance is due to the fact that the RF transistor(s) in the RF PA 3 is maintained at an almost fixed bias during the off-peak of the amplitude of the RF input signal 21.

Certain conventional techniques exist to provide efficiency gains in the RF PA 3. One conventional technique is EER (Envelope Elimination and Restoration). The EER technique applies the amplitude signal and the phase signal of the RF input signal 21 separately to two ports of the power amplifier 3, i.e., its power supply voltage port (Vcc) 32 and its RF input port 30, respectively. However, the EER technique fails to provide significant efficiency gains, because according to the prior-art configurations, the supply voltage 32 cannot be varied in an energy-efficient way to accommodate the large variations in the amplitude signal of the RF input signal 21 and thus it fails to provide a substantial energy efficiency gain while maintaining the required linear amplification of the RF signal in the RF PA 3. This is mainly due to the difficulty in realizing a fast, accurate, wide range, and energy efficient voltage controller to drive the supply voltage of the RF PA 3. Such an energy efficient voltage controller is suggested as described hereinafter with respects to the embodiments of the present invention.

The conventional EER technique can function better only if a variable power supply with a very large variation range is used to adjust the supply voltage based on the amplitude signal of the RF input signal 21, while not reducing the efficiency of the RF transmitter by the power consumed by the method itself. However, the variable power supply, which is typically comprised of a linear regulator (not shown) that varies its output voltage on a fixed current load such as the PA in linear mode, by principle reduces the supply voltage at constant current and by itself consumes the power resulting from its current multiplied by the voltage drop across the linear regulator when there is a large drop in the amplitude signal of the RF input signal 21. This results in no change in the overall battery power being consumed by the RF transmitter, because any efficiency gained in the RF PA 3 is mostly lost in the linear regulator itself. Variations of the EER technique, such as Envelope Following and other various types of polar modulation methods, likewise fail to result in any significant gain in efficiency in the RF transmitter, because the supply voltage is likewise adjusted based on the amplitude signal of the RF input signal 21 which inherently has large variations and thus has the same deficiencies as described above with respect to conventional EER techniques.

Figure 2:
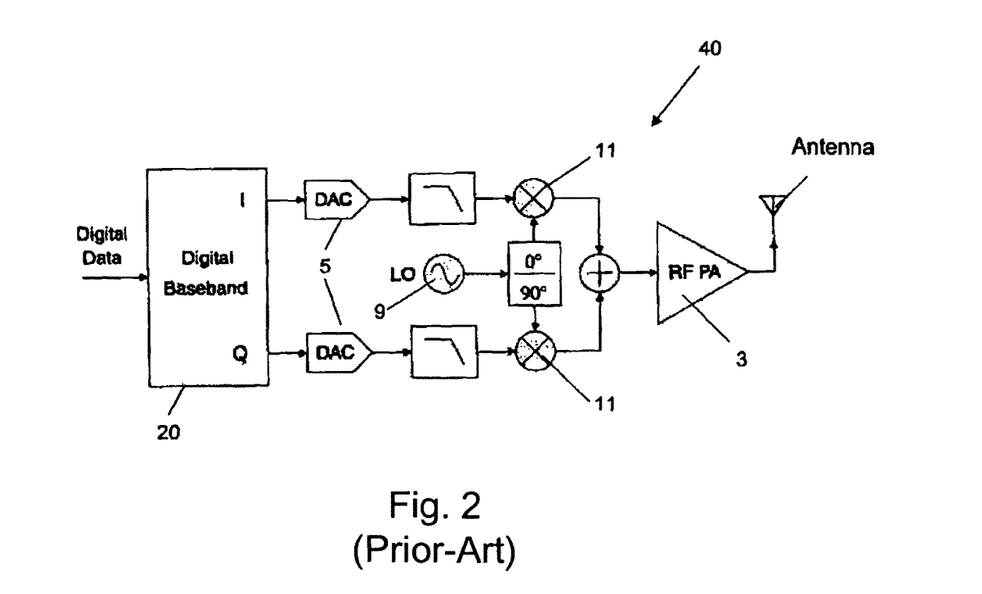
FIG. 2 schematically illustrates a simplified block diagram of a direct conversion transmitter, according to the prior-art.

FIG. 2 schematically illustrates a simplified block diagram of a typical direct conversion transmitter system 40. This is a typical system which comprises a digital baseband 20, I channel and Q channel, Digital to Analog Circuit (DAC) 5 for each of the channels (I and Q), local oscillator 9 and mixing circuit 11. The output of the mixing circuit 11 provides the analog RF signal to be amplified by the power amplifier 3, wherein the amplified signal is directed to the antenna, as it known to a person skilled in the art.

According to an embodiment of the present invention, a mixed-signal circuit is suggested where by using in conjunction both digital and analog circuit techniques, the power consumption of the RF communication system is reduced in a practical and efficient way. The mixed-signal circuit supplies a boost event which is divided into two separate phenomena: the boosted supply trend itself, and the timing. The boost is implemented by circuits which operate in their non-linear region (which are therefore much more power efficient) as described with respect to FIGS. 4 and 6. The exact timing is adjusted according to a parallel linear circuit (e.g., an A/D circuit 6 followed by a correlation unit 7 of FIG. 3), which is not found in the direct path of the boost and hence is very economical in terms of power.

Figure 3:
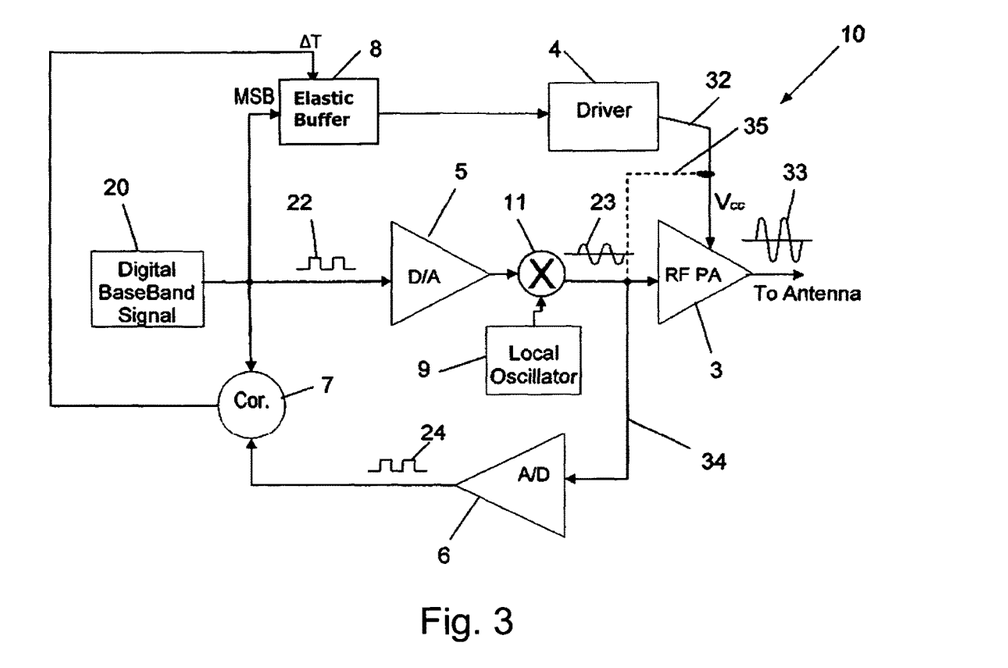
FIG. 3 schematically illustrates an RF transmitter circuit for boosting the voltage supply of power amplifier in high peak to average power ratio applications in accordance with an embodiment of the present invention.

FIG. 3 illustrates an RF transmitter circuit 10 which includes the mixed-signal circuit in accordance with the present invention. The mixed-signal circuit is placed between a transmitter 20 and the PA 3 to correlate by a correlation unit 7 the delay between the digital baseband signal 22 from the transmitter 20 and the digital form signal 24 of the input RF signal 23 provided to the PA 3. The correlation between those signals 22 and 24 is used to control the PA 3 by way of an adjusted supply voltage (i.e., a boost event) by PA driver 4. The PA driver 4 supplies the power supply line (Vcc) 32 to the PA 3.

The PA 3 amplifies the RF signal 23 to output the amplified RF output signal 33, while the RF signal 23 is also provided as a feedback signal (in a converted digital form signal 24 by an auxiliary analog to digital converter A/D 6 of relatively low precision) back to the PA driver 4 via the correlation unit 7. The boost event is provided by the PA driver 4 based on the data signal 24 from A/D 6 and the most significant bits of the input signal received from transmitter 20. The output data from the correlation unit 7 serves to indicate the difference between the phase of the RF input signal 23 and the digital form of the input signal 22. This serves, in turn, to match the delay of RF input signal 23 and the power supply 32. The PA driver 4 switches the required supply voltage (Vcc) based upon the most significant bits of the input signal received from transmitter 20 and the A/D converted signal 24, to provide the required supply voltage to the PA 3, to optimize the efficiency of the PA 3.

The mixed-signal circuit of the present invention operates by controlling the boost event in open-loop with the digital data of the baseband signal. Typically these digital data are supplied in the system with precision of close to 8-10 bit to a digital to analog converter, which after modulation with a carrier wave, are supplied as the input to the RF power amplifier. In order to adjust for the different delays, a provision is made to change the delay of the data stream through a delay circuit 8 (e.g., an elastic FIFO buffer that introduces an adjustable delay of signals such as a Delay Locked Loop (DLL) circuit), implemented in the digital domain for convenience. The delay circuit 8 may be in the path of driver 4 or in the path of RF signal 22 (as shown), modifying the relative timing between the two paths. The digital data have enough precision to enable the control of the power boost through a switching circuit, resulting in a supply boost which has the correct shape to enable the enhancement of the power amplifier supply, for instance through a plurality of coupling capacitors and switches (not shown), while not introducing errors in the communication stream.

The exact timing of the boost is either delayed or brought forward in accordance with the data from auxiliary analog to digital converter (A/D) 6 of low precision which samples the signal at the input of power amplifier 3 and/or at the power supply of power amplifier 3 (as indicated by numeral 34 and by the dotted line 35, respectively), and a digital circuit (i.e., correlation unit 7) which performs a correlation of the data of said auxiliary A/D 6 with the most significant bits of the baseband digital stream.

The A/D 6 converter performs conversions at a low enough resolution (e.g., as low as 4-bits) such that it may perform its function rapidly without consuming substantial amounts of power (i.e., relatively low power consumption of less than 1 mW). Since the digital data are delayed through an elastic buffer and there are no linear circuits in the path of the power boost, the boost signal from driver 4 can be delivered to PA 3 with the correct shape at the precise timing without incurring the expense of high power consumption in the regulation process.

Figure 4:
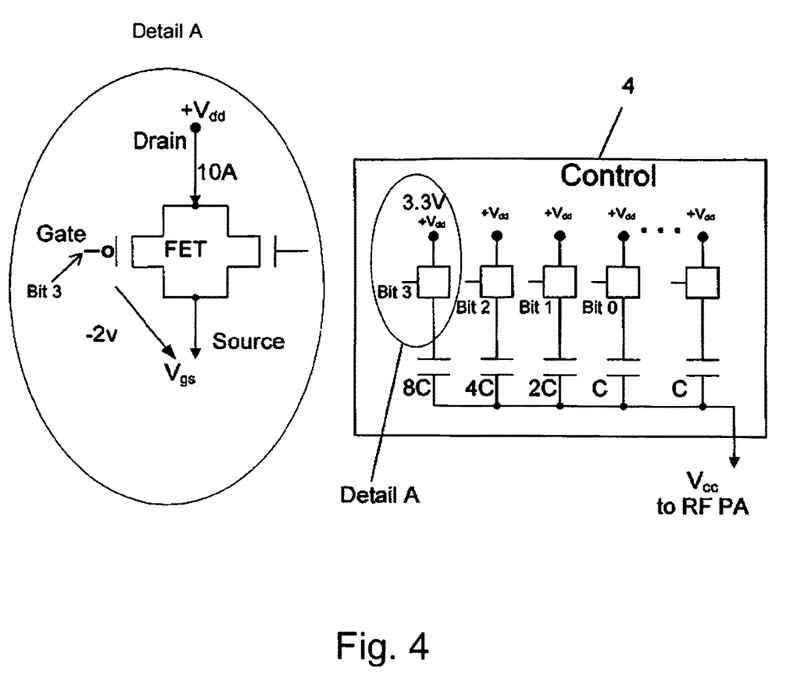
FIG. 4 schematically illustrates a boost control circuit in accordance with an embodiment of the present invention.

FIG. 4 schematically illustrates the switching configuration of the driver 4, according to an embodiment of the present invention. Driver 4 switches between pre-configured series of capacitors by means of FET switches (e.g., as shown with respect to the DC voltages that are set from $V_{dd}$=3.3 Volts). Driver 4 disconnects the direct path of the power supply to the PA 3 and provides a pulse to the required capacitor in order to shape the boost pulse (i.e., its waveform).

Figure 5:
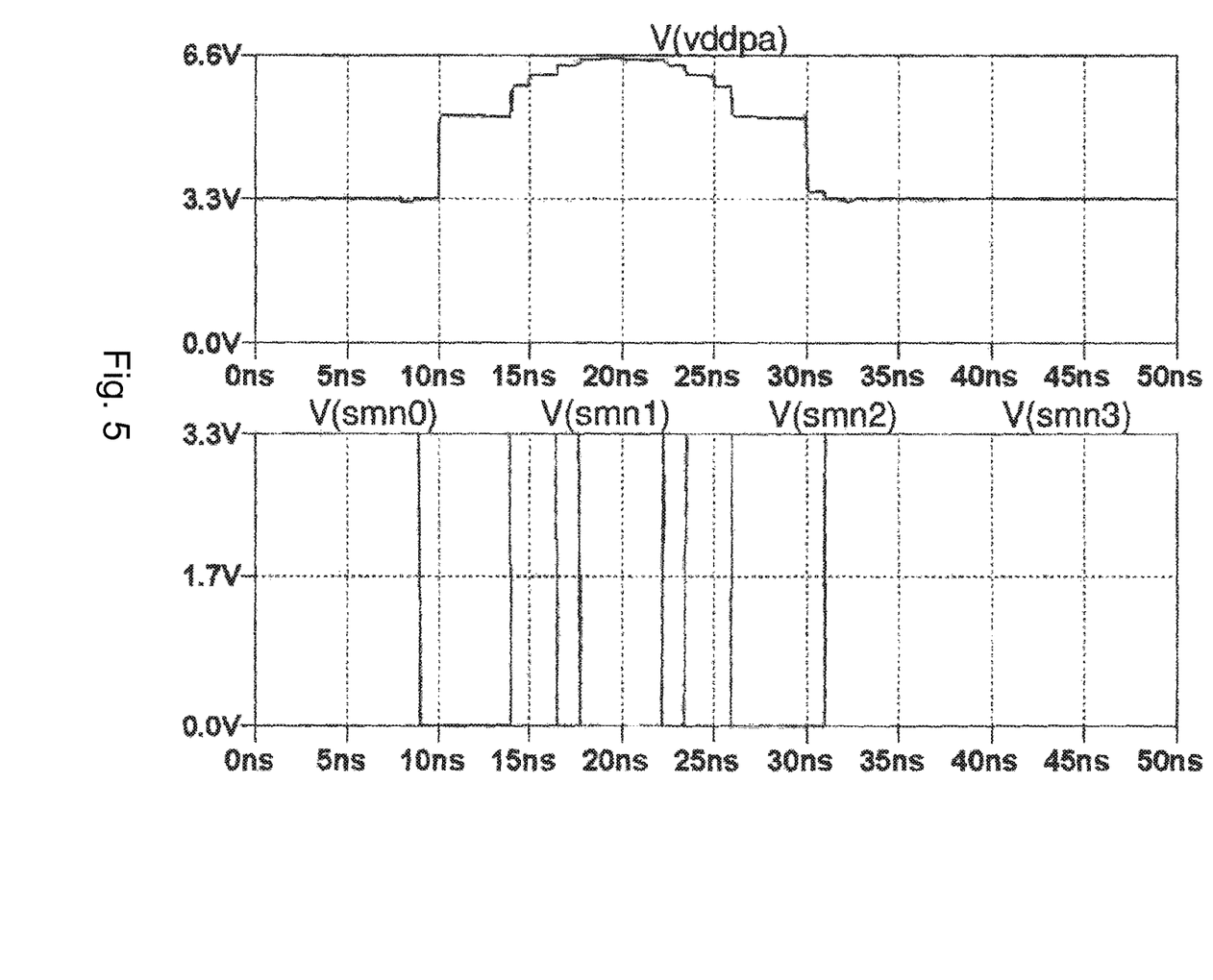
FIG. 5 is a graph showing the waveform of the boosting.

FIG. 5 is a graph showing an example waveform of the PA power supply after boosting. The graph shows the relative digital signals that trigger the different boosting levels; these would be the 4. Most Significant Bits (MSB) of the baseband signal (actually the sum of the I and Q channels).

The simulation results of the changes in the waveform of FIG. 4 are shown in Table 1, which is based on the calculation of the voltage levels of the PA according to the binary decoding of the Most Significant Bits:

TABLE 1

| Base voltage $V_{dd}$ = 3.3 V | Boost (Volts) | Target level | Capacitor ratio |
|---|---|---|---|
| bit 0 | 1.65 V | 4.95 V | Value = C |
| bit 1 | 0.825 V | 5.775 V | Value = 2 × C |
| bit 2 | 0.4125 V | 6.1875 V | Value = 4 × C |
| bit 3 | 0.20625 V | 6.39375 V | Value = 8 × C |

As it shown in the table 1 and the graph of FIG. 5, the levels in the simulation are very close to the target, and well within a 10% mask. The precise value of the capacitors should be easy to calculate to someone skilled in the art, and depend upon the power requirements of the PA itself. The decoding is implemented directly by the ratio between the capacitors (e.g., if "bit 0" is represented by capacitor with value=C, then the ratio between the other capacitors is two times bigger than the previous one for each bit. In case of 4 MSB, the other capacitors are therefore 2C, 4C and 8C, plus a customary dummy capacitor of value C in order to implement the correct ratio, as shown with respect to FIG. 4); furthermore one could utilize more bits of the baseband signal (e.g., 6 MSB), if one desired to obtain a smoother waveform.

Charge Pump

Figure 6:
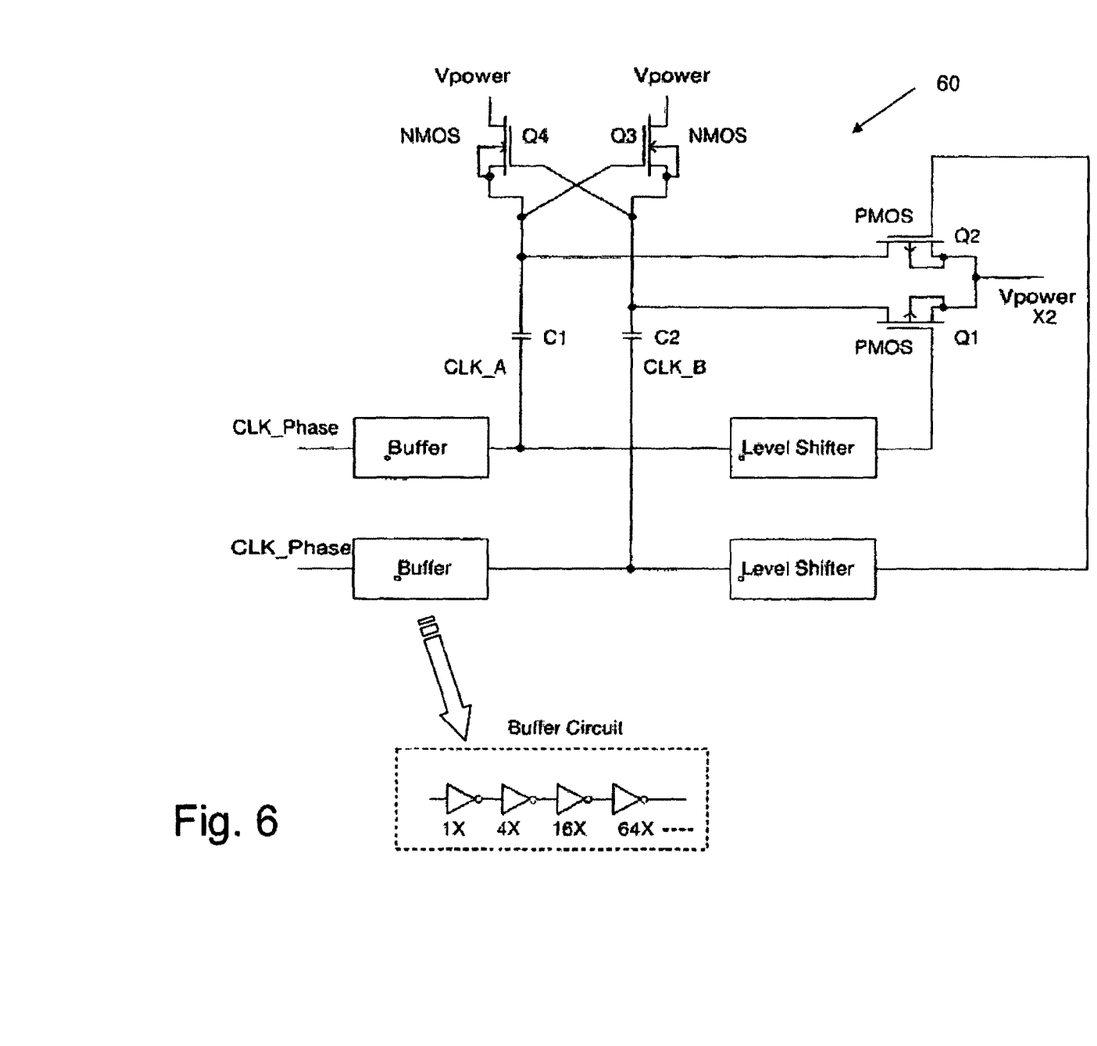
FIG. 6 schematically illustrates a charge pump circuit as voltage doubler, according to an embodiment of the present invention.

FIG. 6 shows a functional diagram of a charge pump circuit that can be used in conjunction with the invention. The circuit illustrated in this figure is particularly convenient because it can be applied as a boost circuit to existing RF transmitter circuit without the need to carry out major alterations in the structure. The circuit generally indicated by numeral 60 is an electronic circuit which charges capacitors from the input voltage and switches these charges in such a way that, in the ideal case, exactly twice the voltage is produced at the output as at its input (i.e., a voltage doubler circuit, which is a well-known technique described in the art). A charge-pump circuit can be implemented in several ways, e.g., as a Dickson type charge pump, cross-coupled switched-capacitor voltage doubler, and the like without departing from the scope of the invention.

A buffer circuit is also preferably selected to have a maximum output that is sufficiently large to drive a charge pump as hereinafter described to provide the required voltage output. Accordingly, it should be understood that the particular circuit configuration of charge pump 60 disclosed in the drawing is merely provided as one possible example of a charge pump that can be used in the present invention. Other charge pump configurations are also possible as would be appreciated by those skilled in the art. Accordingly, the invention is not limited in this regard.

As aforementioned, according to this embodiment of the present invention, the boost is delivered through a plurality of capacitors configured as a charge-pump. The capacitors are preferably discrete capacitors, which owing to their low parasitic capacitance enable the implementation of said charge-pump function with very high efficiency, such as for example efficiency near or better than 90%. Furthermore, although it is itself a switching circuit, the charge-pump follows a linear load-line behavior. Therefore over a particular range of output current and operating conditions, the charge-pump can be controlled to output a voltage in correspondence to a particular input, such as for example the MSB's of the baseband signal. Moreover, when the charge-pump is started it is initialized to the voltage existing at the power supply of the RF amplifier, thus providing a continuous signal to the terminals of said RF amplifier.

The functional diagram of the charge pump 60 is shown in accordance with one embodiment of the present invention. As shown, the charge pump 60 includes a buffer for each clock phase channel (the clock is indicated as CLK_Phase), a level shifter coupled to the output of each buffer, transistors Q1, Q2, Q3 and Q4 (e.g., MOS transistors such as p-type and n-type) and capacitors C1 and C2. In this arrangement, the transistor Q1 and Q2 configured to perform a switching function and Q3 and Q4 as cross-coupled transistors. As shown, each buffer can be configured from a plurality of serially coupled NOT gates (each additional NOT gate increase the multiplication starting at 1×, 4×, 16×, 64×, for instance, and up). The charge pump circuit 60 is supplied by a power input (Vpower) and as a result of its pumping operation it provides at its output a double voltage value (i.e., 2*Vpower).

Figure 7A:
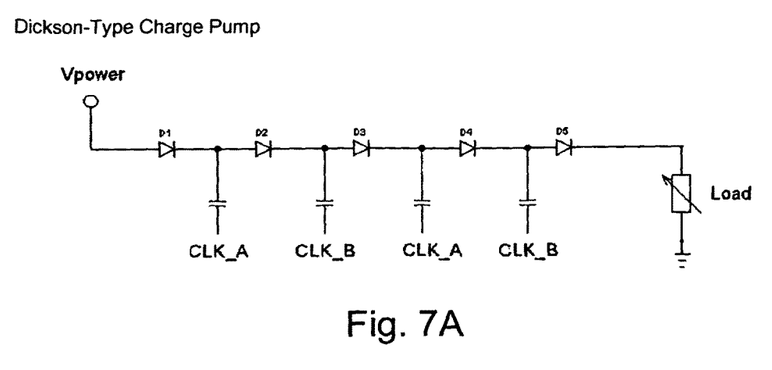
FIG. 7A schematically illustrates a Dickson-type charge pump circuit.
Figure 7B:
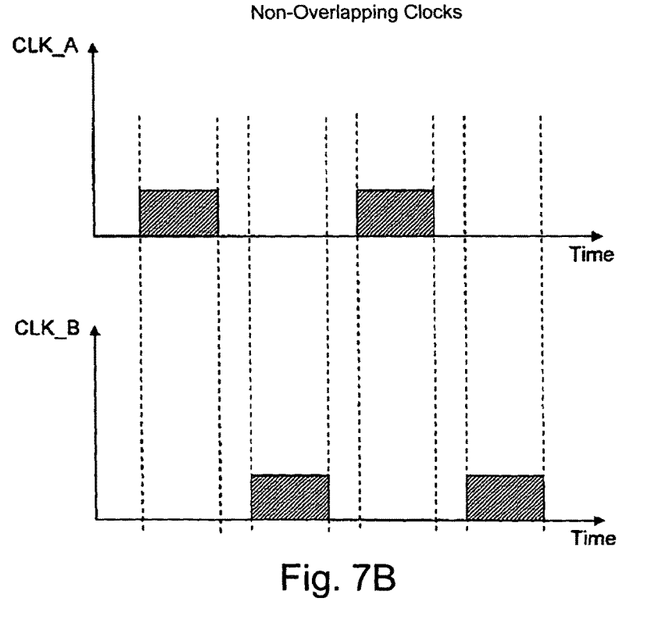
FIG. 7B are graphs showing the non-overlapping clocks of the circuit of FIG. 7A.

Referring now to FIGS. 7A and 7B, a Dickson-type charge-pump is shown that can be used in conjunction with the present invention. This circuit includes serially coupled diodes (e.g., D1-D5) and load capacitors coupled between adjacent diodes. It can be readily seen from the graph of FIG. 7B that timing of the clocks (CLK_A and CLK_B) are not overlapping in order to guarantee that the charge is always transported in the correct direction.

Figure 8:
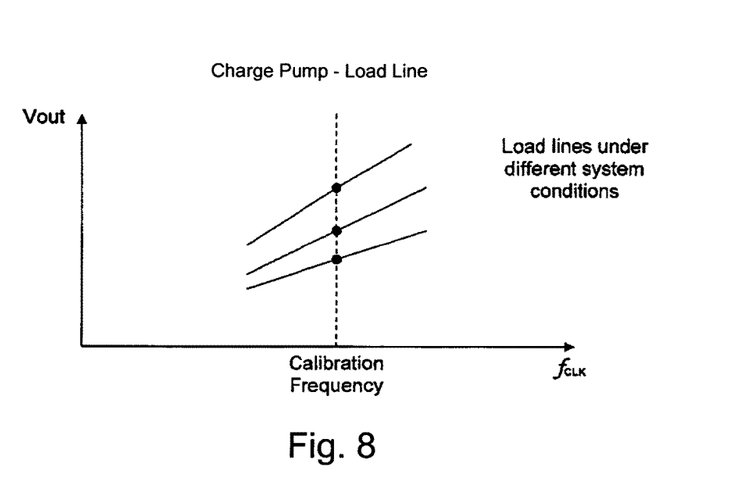
FIG. 8 is a graph showing the charge pump load line.

In another embodiment of the present invention, the load line behavior of the charge-pump can be calibrated in the background to the required precision by comparing the output of the charge-pump itself with known features of the bit stream, such as for example but not limited to the peaks in the preamble of the OFDM frame. Owing to the substantially linear response of the charge-pump circuit with respect to the frequency of the clock driving the capacitors, the output of the charge-pump can be suitably calibrated to match the shape of the bit stream; therefore enabling the substantially linear regulation of the output voltage of the charge-pump to the required precision, while the internal operation of the circuit itself is highly non-linear in nature and therefore economical in terms of power. A graph showing the substantially linear response of load lines under different system conditions is shown in FIG. 8 (an example of calibration at a particular frequency is indicated by the dotted line).

The comparison is carried out thanks to the auxiliary A/D, as previously described for the invention, while the timing is adjusted thereto also as described in the invention. Therefore the invention is implemented in a particularly economical way, and in particular without the need for components that cannot be easily included in a miniaturized system.

Figure 9:
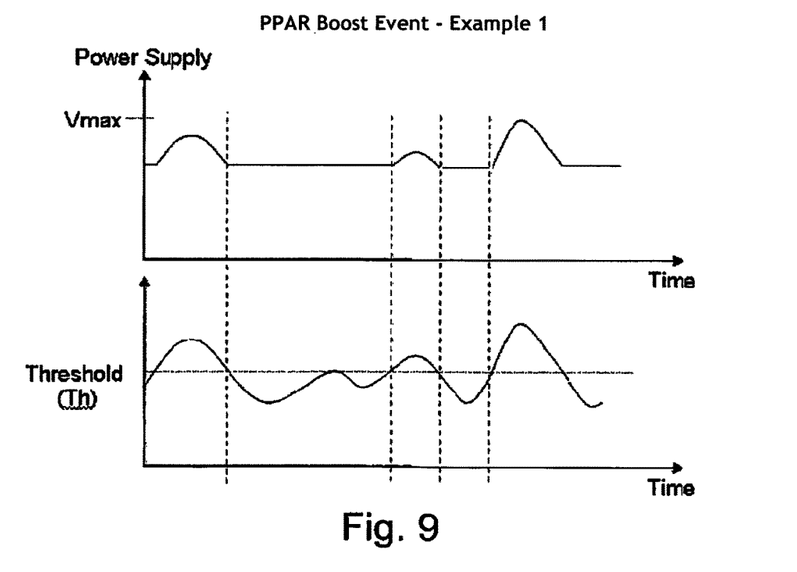
FIGS. 9 and 10 are graphs showing the PPAR boost event.
Figure 10:
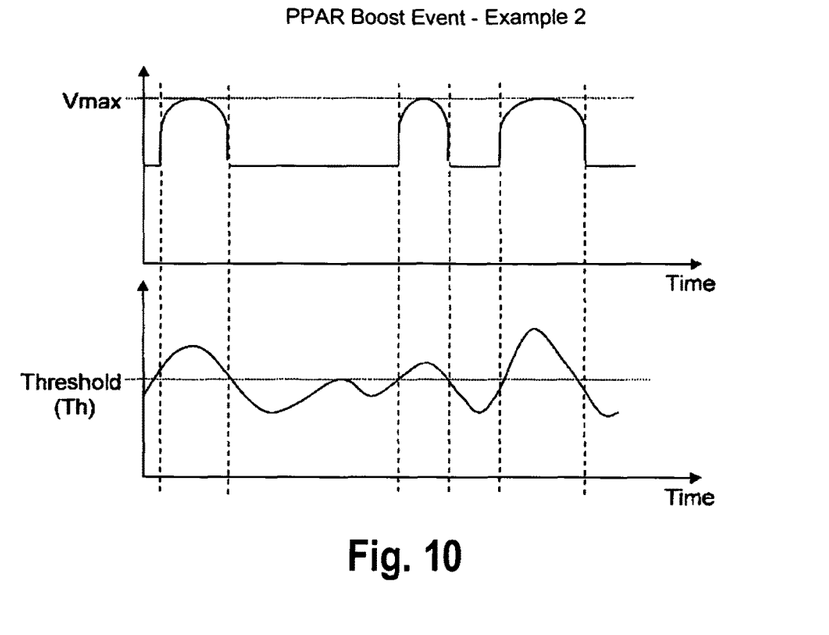

FIGS. 9-10 are showing the shape of the power during the boost event as provided by applying the charge pump circuit 60 of FIG. 6 to the RF amplifier.

FIG. 9 is graph showing the boost event response, according to one embodiment of the invention. In this embodiment, when the input signal exceeds a threshold level (Th), the power supply is increased tracking the amount in excess of the threshold.

FIG. 10 is graph showing the boost event response, according to another embodiment of the invention. In this embodiment, when the input signal exceeds a threshold level (Th), the power supply is increased to the maximum value (i.e., full blast).

As will be appreciated by the skilled person the arrangement described in the figures results in an effective boost circuit, such that the extent of the boost impact makes it possible to effectively boost the voltage of the RF transmitter circuit.

Upon reading this disclosure, those of skill in the art will appreciate still additional alternative structural and functional designs for the RF power amplifier controller through the disclosed principles of the present invention. For example, according to another embodiment of the present invention, the boost is delivered through a plurality of capacitors. Said capacitors are ratioed in a way such that the appropriate boost may be delivered to the supply of the power amplifier by capacitive coupling from a single DC voltage. The power amplifier mixed signal circuit can be used with any type of power amplifier for many different types of electronic devices, although the embodiments described herein refer to an RF PA controller used in mobile telephone applications.

The system suggested by the present invention as described hereinabove is much economical in term of power. Using the system may save up to several decibels (e.g., about 6 dB-10 dB). Assuming that the Peak-to-Average Power Ratio of optimal OFDM is [(K^2)/K], a practical value of such ratio is about 12 dB (this assumption is well known in the art, and is readily available, for instance online at a website such as "DSP log", URL address: http://www.dsplog.com). Therefore, at least part of this can be saved (e.g., about 6 dB-10 dB) depending on the efficiency of the circuit that implements the trending.

While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A system for boosting the power supply of a RF power amplifier in high peak to average power ratio applications, wherein the power amplifier is coupled to receive and amplify a digital data stream of a baseband signal, which is supplied as an RF input signal to the power amplifier to generate an RF output signal, the system comprising:
   a. a first circuit for controlling a boost event in open-loop with the digital data stream, wherein a timing of the boost event can be adjusted according to delays in the digital data stream; and
   b. a second circuit for adjusting the timing of the boost event in such a way that the signal which controls the second circuit is a result of a comparison between a digital representation of the RF input signal and/or a digital representation of the power supply, and the digital baseband signal, wherein the comparison represents a substantial matching of the delays in the paths of the RF input signal and the power supply; and
   wherein the boost event is delivered through a plurality of capacitors configured as a charge-pump, and a shape of the boost is generated by capacitive coupling from a single DC voltage.

2. A system according to claim 1, in which the shape of the boost event is generated by capacitive coupling from a single DC voltage.

3. A system for boosting the power supply of a RF power amplifier in high peak to average power ratio applications, wherein the power amplifier is coupled to receive and amplify a digital data stream of a baseband signal, which is supplied as an RF input signal to the power amplifier to generate an RF output signal, the system comprising:
   a. a first circuit for controlling a boost even in open-loop with the digital data stream, wherein the timing of the boost event can be adjusted according to delays in the digital data stream; and
   b. a second circuit for adjusting the precise timing of the boost event in such a way that the signal which controls the second circuit is the result of a comparison between a digital representation of the RF input signal and/or a digital representation of the power supply, and the digital baseband signal, wherein the comparison represents the substantial matching of the delays in the paths of the RF input signal and the power supply; and
   in which the precise timing between the signal supplied to the power amplifier and its power supply is adjusted by means of an elastic buffer that introduces an adjustable delay, wherein the elastic buffer is implemented with a Delay Locked Loop circuit.

4. A system according to claim 3, in which the second circuit comprises an auxiliary analog to digital (AID) converter which samples a signal at an input of the power amplifier, and further comprising a digital circuit which performs a correlation of the data of the auxiliary converter with the digital baseband signal.

5. A system according to claim 4, in which the timing of the boost event is either delayed or brought forward in accordance to data from the second circuit.

6. A system according to claim 1, in which the first circuit comprises a plurality of switches, each of which is connected to a different voltage.

7. A system according to claim 1, in which the first circuit can be used with any type of power amplifier for multiple different types of electronic devices.

8. A system according to claim 1, in which the delay in the path of the first circuit is matched to the delay in the path of the RF input signal to the power amplifier.

9. A system according to claim 1, in which the second circuit falls outside of a direct path of the power amplifier.

10. A method for boosting the supply of power amplifier in high peak to average power ratio applications, wherein the power amplifier is coupled to receive and amplify a digital data stream of a baseband signal, which is supplied as an RF input signal to the power amplifier to generate an RF output signal, the method comprising the steps of:
   a. controlling the boost in open-loop with the digital data stream, wherein a timing of the boost event can be adjusted according to delays in the digital data stream; and
   b. adjusting a precise timing of the boost event in such a way that the signal which controls the second circuit is a result of a comparison between a digital representation of the RF input signal and/or a digital representation of the power supply, and the digital baseband signal, wherein the comparison represents a substantial matching of a delay in a path of the power supply to the power amplifier and a delay in a path of the input signal to the power amplifier.

11. A method according to claim 10, wherein the phase delay introduced in the path of the power supply to the power amplifier is substantially matched to the delay in the path of the input signal to the power amplifier.

* * * * *